(12) United States Patent
Ward et al.

(10) Patent No.: US 6,388,467 B1
(45) Date of Patent: May 14, 2002

(54) HIGH VOLTAGE TOLERANT OUTPUT DRIVER FOR SUSTAINED TRI-STATE SIGNAL LINES

(75) Inventors: Richard A. Ward, Santa Anna; Mark R. Tennyson, Irvine; Anil Mankar, Mission Viejo, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/408,455

(22) Filed: Sep. 30, 1999

(51) Int. Cl.$^7$ ................ H03K 19/00; H03K 19/0175
(52) U.S. Cl. .................... 326/56; 326/83; 326/80
(58) Field of Search .................... 326/56–58, 80–81, 326/82–83

(56) References Cited

U.S. PATENT DOCUMENTS

| | | | |
|---|---|---|---|
| 5,570,043 A | * 10/1996 | Churchill | 326/81 |
| 5,635,860 A | * 6/1997 | Westerwick | 326/81 |
| 5,635,861 A | * 6/1997 | Chan et al. | 326/81 |
| 5,825,206 A | * 10/1998 | Krishnamurthy et al. | 326/81 |
| 5,831,447 A | * 11/1998 | Chaw | 326/27 |
| 6,040,712 A | * 3/2000 | Mejia | 326/82 |

* cited by examiner

Primary Examiner—Michael Tokar
Assistant Examiner—Daniel D. Chang
(74) Attorney, Agent, or Firm—Akin, Gump, Strauss, Hauer & Feld, L.L.P.

(57) ABSTRACT

An integrated circuit comprising a relatively simple high voltage tolerant output circuit that may be placed in a high impedance state (i.e., tri-stated) when the voltage at a corresponding signal connection point reaches a predetermined voltage reflecting a logic high level. In one embodiment of the invention, the output circuit is responsive to assertion of a control signal to selectively enter a high impedance state. The control signal is asserted by a control circuit following the detection of a logic high signal of a predetermined duration at the external signal connection point. The predetermined duration may correspond to transmission line delays of a signal line driven by the output circuit. For example, the delay in placing the output circuit in a high impedance state may correspond to the length of time needed to allow transmission line reflections to dissipate to an acceptable level. Disabling the output circuit following such a delay severs the potential current path between the supply voltage of the integrated circuit and an external voltage source coupled to the signal line via a pull-up device.

18 Claims, 5 Drawing Sheets

HIGH VOLTAGE TOLERANT OUTPUT DRIVER FOR SUSTAINED TRI-STATE SIGNAL LINES

BACKGROUND

1. Technical Field

This invention relates to I/O (input/output) circuitry in a semiconductor device; and, more specifically, it relates to high voltage tolerant I/O circuitry coupled to a sustained tri-state signal line, wherein the voltage on the sustained tri-state signal line may be higher than that of the core circuitry of the integrated circuit.

2. Description of Related Art

Advances in the semiconductor processes used to manufacture today's integrated circuits, in combination with the ever-present need for reduced power consumption, have resulted in semiconductor devices capable of utilizing relatively low operating voltages. For example, operating voltages of 3.3 volts and even 1.8 volts have become common replacements for the traditional 5 volt operating standard. The use of lower operating voltages enables higher frequency operation, as the voltage applied across a semiconductor device is related to its miaximum switching frequency.

In a typical computer system architecture, a processor is coupled to various other devices such as high-speed peripherals, system memory, controllers, etc. via a high-performance bus. An example of such a bus is the PCI Local Bus (PCI bus). The PCI bus is a high-performance bus that provides a processor-.independent data path between the processor and high-speed peripherals. All signals of the PCI bus are bi-directional. The PCI bus is designed to accommodate multiple high-performance peripherals for graphics, motion video, SCSI, LAN, etc. The PCI bus supports two different signaling voltages, 5 volts and 3.3 volts. A given PCd-compatible device may support either or both signaling voltages. Other bus standards or proprietary signaling schemes may have similar voltage requirements.

One known method of supporting both PCI signaling voltages is to use an integrated circuit with a 3.3 volt operating voltage and 5 volt tolerant input/output (I/O) pads. The output pads of such a device drive only 3.3 volts, which satisfies PCI bus specifications. However, this approach may result in 5 volt signals being applied to the I/O pads from an external voltage Source.

Various problems may arise in such a configuration. For example, with certain PCI bus signals, referred to as Sustained Tri-State (STS) signals (e.g., PERR#, SERR#), use of a 5 volt tolerant method to support both 5 volt and 3.3 volt signals may result in the core logic operating voltage of the integrated circuit being less than the logic high voltage level of the STS signal line.

More specifically, the STS signals are required by specification to have a pull-up resistor to either 5 volts or 3.3 volts depending on the specific implantation. When the pull-up resistor is connected to 5 volts, a problem develops if the output driver of the integrated circuit is driving a logic high level (e.g., 3.3 volts). Since the output driver may only drive up 3.3 volts, the 5 volt source coupled to the STS signal may source current through the pull-up resistor to the integrated circuit. The problem is exacerbated with each additional signal that is coupled to the integrated circuit in this manner.

The current sourced to the integrated circuit may cause various problems. For example, the difference between the pull-up voltage at the STS signal line and the operating voltage of the core logic may cause current to be sourced to the core logic, thereby causing a rise in the level of the core operating voltage. The core logic may be damaged when a voltage exceeding its maximum operating voltage is applied. In addition, the unintended flow of current may drain power from the system. Noise and thermal issues may also arise.

Other deficiencies and disadvantages of the prior art will become apparent to one skilled in the art after comparing such prior art to the present invention as described herein.

SUMMARY OF THE INVENTION

Briefly, an integrated circuit according to the present invention mitigates the deleterious effects of mismatches between the core logic operating voltage and a voltage at an external signal connection point such as a bond pad. The integrated circuit comprises a relatively simple high voltage tolerant output circuit that may be placed in a high impedance state (i.e., tri-stated) when the voltage at a corresponding signal connection point reaches a predetermined voltage reflecting a logic high level.

In one embodiment of the invention, the output circuit is responsive to assertion of a control signal to selectively enter a high impedance state. The control signal is asserted by a control circuit following the detection of a logic high signal of a predetermined duration at the external signal connection point. The predetermined duration may correspond to transmission line delays.

For example, the delay in placing the output circuit in a high impedance state may correspond to the length of time needed to allow transmission line reflections to dissipate to an acceptable level. Disabling the output circuit following such a delay severs the potential current path between the internal operating voltage rails of the integrated circuit and an external voltage source coupled to the signal line via a pull-up device. A corresponding method for controlling an output buffer of an integrated circuit is also disclosed.

The control circuit may receive an indication of the voltage level at the external signal connection point via an input buffer coupled to the external signal point. Alternatively, the control circuit may itself be controlled by core logic of the integrated circuit.

Thus, an output circuit or output driver implemented in accordance with the present invention minimizes the potentially harmful effects of coupling an integrated circuit operating at one voltage to a signal line (such as a sustained tri-state signal line) coupled to a higher voltage.

BRIEF DESCRIPTION OF DRAWINGS

A better understanding of the present invention can be obtained when the following detailed description of an exemplary embodiment is considered in conjunction with the following drawings, in which.

DETAILED DESCRIPTION OF DRAWINGS

Figure 1:
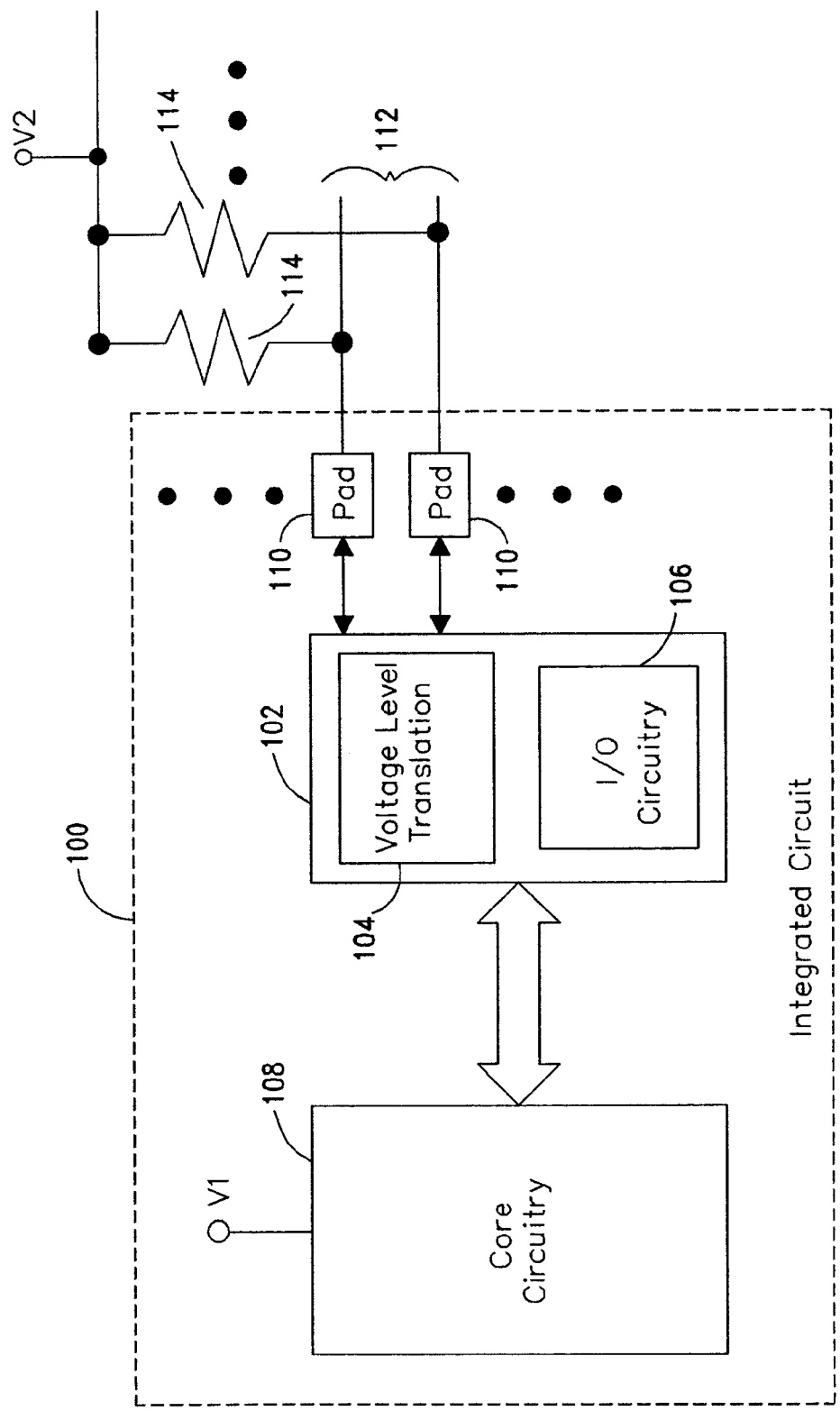
FIG. 1 is a block diagram providing exemplary details of an integrated circuit implemented in accordance with the present invention.

FIG. 1 is a block diagram providing exemplary details of an integrated circuit 100 implemented in accordance with the principals of the present invention. The integrated circuit 100 includes high-voltage tolerant output circuitry capable of mitigating potential problems that may arise when the integrated circuit 100 is coupled to an external voltage source V2 that is greater than an internal operating voltage V1. In particular, an undesired current path may develop due to the voltage differential between the external voltage source V2 and the internal operating voltage V1.

Referring more specifically to the integrated circuit 100, interface circuitry 102 is provided for receiving external signals for provision to core circuitry 108, and for providing signals from the core circuitry 108 to external components. The interface circuitry 102 comprises input/output (I/O) circuitry 106 and optional voltage level translation circuitry 104. In the illustrated embodiment of the invention, individual signal paths are provided from the interface circuitry 102 to an external bus 112 via one or more external connection points 110. As will be appreciated by those skilled in the art, the external signal connection points 110 may take the form of bond pads for receiving a bond wire, a solder point for use in flip-chip packaging, or any other packaging technology used to couple an integrated circuit 100 to external signals lines.

The external bus 112 itself may take many forms. For example, the external bus 112 may be compliant with bus standards such as the aforementioned PCI Local bus standard. As specified in the PCI bus standard, a number of signal lines are designated as sustained tri-state (STS) signal lines. Each such STS signal line is individually coupled to an external voltage source V2 via a respective pull-up device 114 (in this case, resistors). The pull-up devices 114 function to establish a known voltage on the specified signal lines during periods of sustained high-impedance in which the signal lines are not necessarily driven by a device such as the integrated circuit 100.

When a logic high level is driven on one of the external signal connection points 110 by the I/O circuitry 106, the voltage level at the external signal connection point 110 typically does not exceed the internal operating voltage V1 of the integrated circuit 100. In situations wherein the external voltage source V2 is greater than the internal operating voltage V1, a voltage differential exists and current may flow from the external voltage source V2, through a pull-up device 114 and into the integrated circuit 100. As noted above, the effect of this undesired current, and any associated rises in the internal operating voltage V1 of the integrated circuit, may cause a myriad of problems.

In an integrated circuit 100 according to the present invention, when a logic high level is driven on an external signal connection point 110, the portion of the input/output circuitry 106 driving the logic high level is disabled (e.g., placed in a high-impedance or high-state mode) following a predetermined period of time. The predetermined duration may be related to transmission line delays. When operating in this manner, the integrated circuit 100 thus utilizes the fact that it may not be necessary to continue to drive the logic high level on the signal line of the bus 112 following an initial period in which other components of the system have had sufficient time to receive the signal. Thus, the invention reduces the effect of any undesired current flowing into the integrated circuit 100, which is of even greater concern when a number of such signal lines are coupled to the integrated circuit 100.

Figure 2:
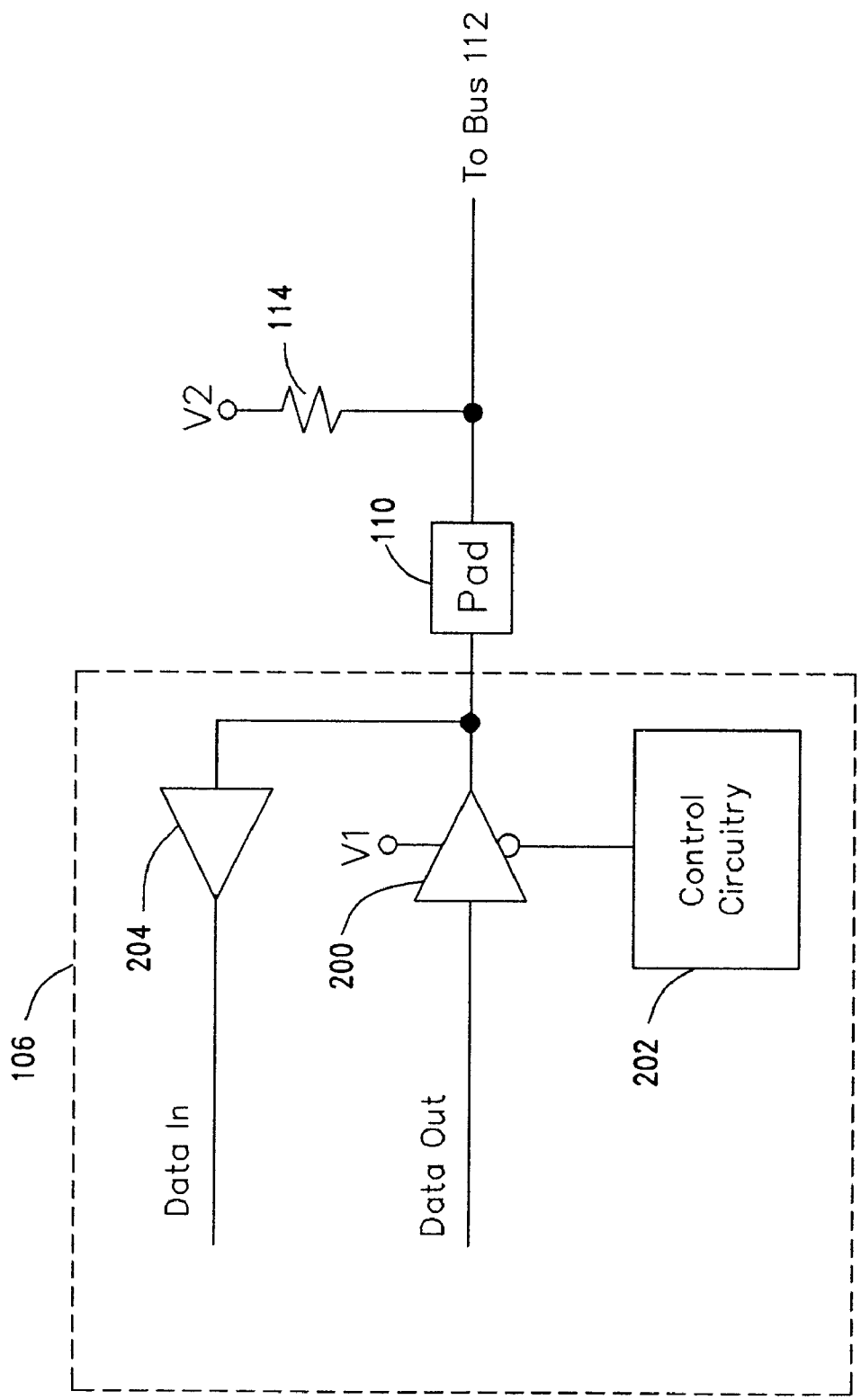
FIG. 2 is a block diagram illustrating an exemplary embodiment of the input/output circuitry of FIG. 1 according to the present invention.

FIG. 2 is a block diagram illustrating an exemplary embodiment of the I/O circuitry 106 of the FIG. 1 according to the present invention. In this embodiment, the I/O circuitry 106 comprises a tri-state output circuit 200 (e.g., a tri-state buffer) for providing output signals DATA OUT to the external signal connection point 110. The tri-state output circuit 200 may be selectively placed in a high-impedance/tri-state mode in response to a control signal from the control circuitry 202. The input node of an input buffer 204 is also coupled to the respective external signal connection point 110 for receiving input signals DATA IN from the bus 112. The input buffer 204 functions to provide signal buffering between the external signal connection point 110 and the core circuitry 108.

The control circuitry 202 is configured to place the tri-state output circuit 200 into a high-impedance state following provision of a logic high level at the external signal connection point 110 for a predetermined amount of time. As illustrated in greater detail below in conjunction with FIG. 3, in order to determine when a logic high signal is provided to the external signal connection point, the control circuitry 202 may monitor the output of the input buffer 204. Alternatively, the control circuitry 202 may also monitor output signals DATA OUT from the core circuitry 108.

Figure 3:
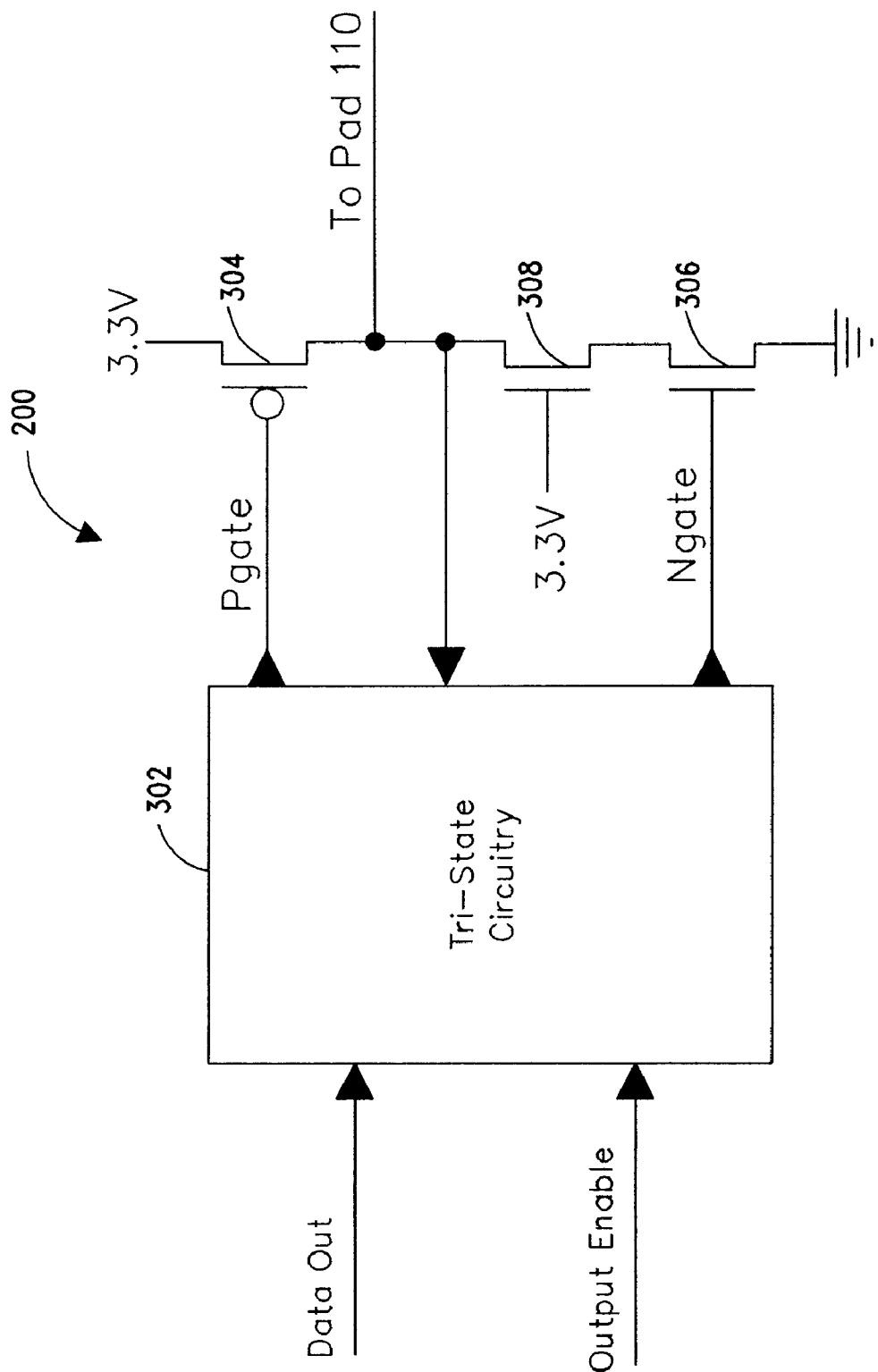
FIG. 3 is a schematic diagram illustrating exemplary details of the input/output circuitry of FIG. 2 in accordance with the present invention.

FIG. 3 is a schematic diagram illustrating exemplary details of the I/O circuitry 106 of FIG. 2 in accordance with the present invention. More specifically, exemplary details are provided for the tri-state output circuit 200. An output signal DATA OUT from the core logic 108 is provided to tri-state control circuitry 302. The tri-state control circuitry 302 is controlled by an output enable signal OUTPUT ENABLE provided by control circuitry 202 (FIG. 2). When the output enable signal OUTPUT ENABLE is asserted, the tri-state control circuitry 302 provides the DATA OUT signal to an external connection point 110 by appropriately driving the transistor gates of a buffer stage formed by a p-channel (PMOS) transistor 304 and an n-channel (NMOS) transistor 306 arranged in an inverting configuration. A high voltage protection NMOS transistor 308 is provided in series between the external signal connection point 110 and the NMOS transistor 306. The gate of the high voltage protection NMOS transistor 308 is coupled to a voltage supply (such as the 3.3 volt supply of the disclosed embodiment) in order to limit the voltage across the gate oxide of the NMOS transistor 308, providing high voltage tolerance. For example, without the high voltage protection NMOS transistor 308, the voltage across the gate oxide of the NMOS transistor 308 could rise to 5 volts when the NMOS transistor 308 is turned off, potentially exceeding the design rules of the semiconductor process used to form the tri-state output circuit 200.

In the illustrated embodiment, the external signal connection point 110 is coupled to an external voltage source of 5 volts via a pull-up resistor 114. The tri-state output circuit 200 is configured to utilize an operating voltage of 3.3 volts. Thus, when the PMOS transistor 304 is turned on to drive a logic level high signal on the bus 112, a potential current exists between the 5 volt voltage source and the 3.3 volt supply rail. To sever this current path, the tri-state control circuitry 302 may be configured by the control circuitry 202 to turn off the PMOS transistor 304 following a predetermined amount of time. When both the PMOS transistor 304 and the NMOS transistor 306 are turned off, the tri-state output circuit 200 is effectively in a high-impedance state.

It is contemplated that the tri-state output circuit 200 may take many forms and still remain operable within the context of the present invention. For example, the tri-state output circuit 200 may comprise a greater or lesser number of buffer/output driver stages. Numerous other operable variations to the tri-state output circuit 200 will be apparent to those having skill in the art. In any such embodiments, the tri-state output circuit 200 incorporates means for disabling the signal path between the supply rail of the integrated circuit 100 and the external signal connection point 110, placing the tri-state output circuit 200 in a high-impedance mode.

Figure 4:
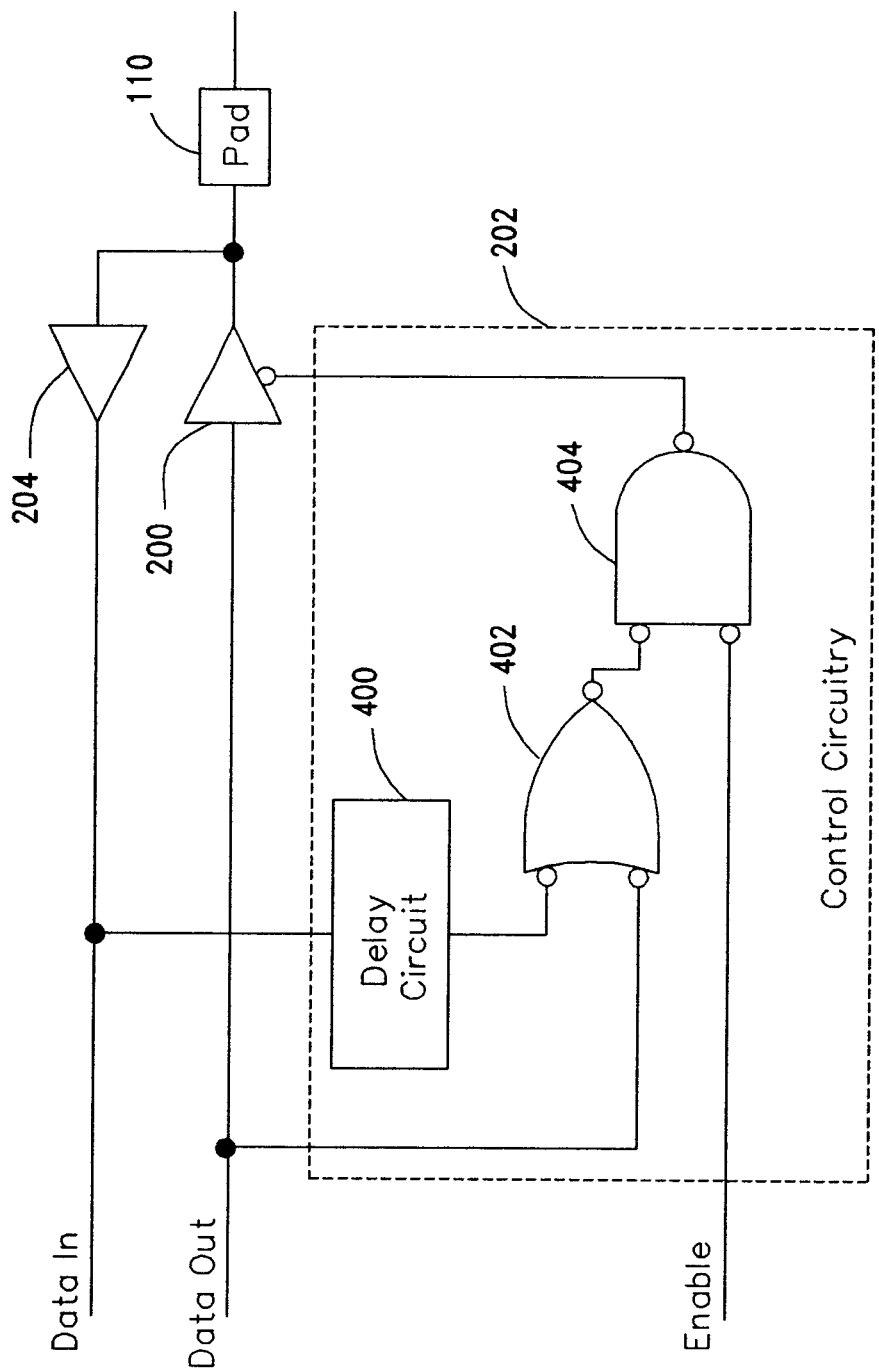
FIG. 4 is a schematic diagram providing exemplary details of the control circuitry of FIG. 2 in accordance with the present invention.

FIG. 4 is a schematic diagram providing exemplary details of the control circuitry 202 of FIG. 2 in accordance with the present invention. In this embodiment, the control circuitry 202 monitors a delayed version of the output of the input buffer 204 to determine when a logic high level has been present on the external signal connection point 110 for a predetermined amount of time. More specifically, a delay circuit 400 receives the output of the input buffer 204, providing a delayed and inverted version of this signal to one input of a two input NOR gate 402. The other input of the NOR gate 404 is coupled to an inverted version of the output signal DATA OUT, Such that the output of the NAND gate 402 is at a logic high level when the voltage level at the external signal connection point 110 has been at a logic high level for a period of time determined by the delay of the delay circuit 400. An inverted version of the output of the NAND gate 402 is provided to one input of a two-input NAND gate 404. The second input of the NAND gate 404 is driven by an enable signal provided by the core logic 108. Thus, when the logic high level is present at the external signal connection point 110 for the predetermined amount of time, and the enable signal is asserted, the output of the NAND gate 404 is asserted (in this case, to a logic low level) and the tri-state output circuit 200 is placed in a high-impedance mode.

Again, as will be appreciated by those skilled in the art, numerous operable modifications to the control circuitry 202 may be enacted without departing from the spirit and scope of the present invention.

Figure 5:
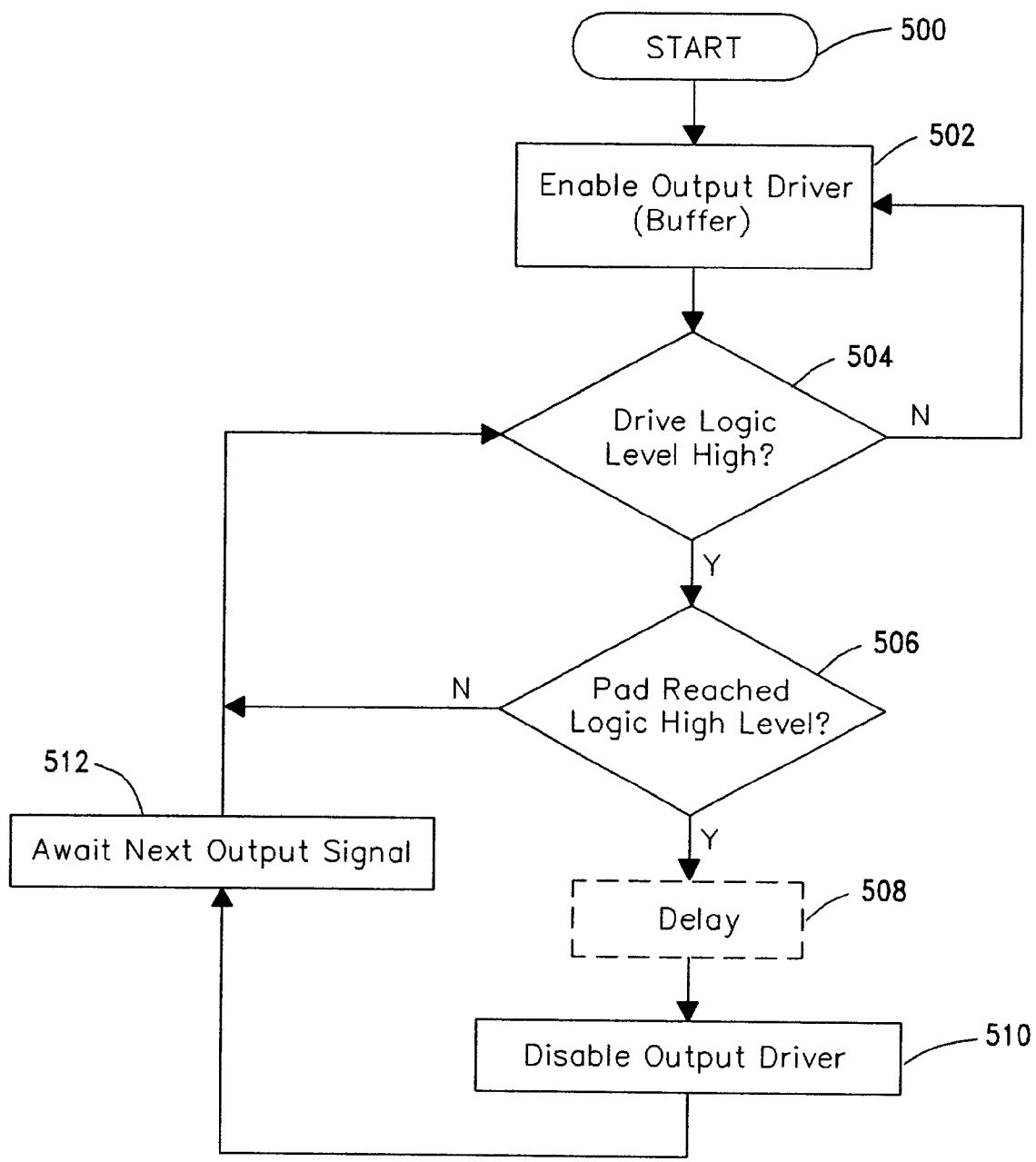
FIG. 5 is a flow chart depicting exemplary steps according to the present invention for controlling an output buffer of an integrated circuit such as that shown in FIG. 1.

FIG. 5 is a flow chart depicting exemplary steps according to the present invention for controlling an output buffer and integrated circuit 100 such as that shown in FIG. 1. Following initialization of the integrated circuit 100 at step 500, the output driver (e.g., tri-state output circuit 200) is selectively enabled at step 502 to provide signals to external circuitry. The output driver may be enabled, for example, when the integrated circuit 100 is serving as a bus master for an external bus coupled to the output driver.

Next, in step 504, control circuitry 202 determines if the output driver is configured to drive a logic high level on an external signal connection point 110. If not, the process returns to step 502. However, if the output driver begins driving a logic high level, the control circuitry 202 monitors the external signal connection point 110 to determine when it reaches a predetermined voltage level reflecting a logic high signal. Following detection of such a logic high signal, a delay is instituted at step 508.

Upon the completion of a delay of a predetermined duration of time, the output driver is disabled in block 510, thereby severing the potentially harmful current path. The output driver remains disabled while the control circuitry 202 awaits the next output signal in block 512, following which the process returns to step 504.

Thus, an output circuit or output driver implemented in accordance with the present invention minimizes the potentially harmful effects of coupling an integrated circuit operating at one voltage to a signal line coupled to a higher voltage.

In view of the above detailed description of the present invention and associated drawings, other modifications and variations will now become apparent to those skilled in the art. It should also be apparent that such other modifications and variations may be effected without departing from the spirit and scope of the present invention.

What is claimed is:

1. An integrated circuit producing output signals for provision to a signal line coupled to an external voltage supply through a pull-up device, the integrated circuit comprising:

an external signal connection point;

a tri-state output circuit having an output node coupled to the external signal connection point for providing a logic high signal to the signal line, the tri-state output circuit responsive to assertion of a control signal to selectively enter a high-impedance state; and a control circuit coupled to the tri-state output circuit for selectively asserting the control signal in response to signals at the external signal connection point, the control circuit comprising:

a delay circuit, wherein the delay circuit introduces a delay based upon transmission line delays of the signal line.

2. The integrated circuit of claim 1, wherein the control circuit asserts the control signal following detection of a logic high signal of a predetermined duration at the external signal connection point.

3. The integrated circuit of claim 2, further comprising an input buffer having an input node and an output node, the input node coupled to the external signal connection point and the output node coupled to the control circuit for providing an indication of the voltage level at the external signal connection point.

4. The integrated circuit of claim 1, wherein the tri-state output circuit comprises a tri-state buffer.

5. The integrated circuit of claim 1, wherein the tri-state output circuit comprises at least one buffer stage.

6. The integrated circuit of claim 1, wherein the external signal connection point comprises a bond pad for coupling to a bond wire.

7. The integrated circuit of claim 1, wherein the external signal connection point comprises a solder point for coupling to a bond wire.

8. The integrated circuit of claim 1, further comprising core logic providing signals to an input node of the tri-state output circuit for communication to the external signal connection point.

9. The integrated circuit of claim 8, the core logic further providing an enable signal to the control circuit for selectively disabling the control circuit.

10. The integrated circuit of claim 1 manufactured by a complementary metal-oxide-semiconductor process.

11. A method for controlling an output buffer of an integrated circuit, the output node of the output buffer being coupled via an external device to an external voltage source providing a voltage level greater than the operating voltage of the output buffer, comprising:

determining when the output node of the output buffer has reached a predetermined voltage level reflecting a logic high signal; and disabling the output buffer following a predetermined delay, wherein the predetermined delay is related to transmission line delays of a signal line external to the integrated circuit.

12. The method of claim 11, wherein the output buffer is disabled by a control circuit coupled to the output node of the output buffer.

13. The method of claim 12, wherein the control circuit is coupled to the output node via an input buffer, the input buffer providing an indication of the output node has reached the predetermined voltage level.

14. The method of claim 11, wherein the output buffer is disabled by placing it in a high impedance state.

15. A computing device producing output signals, the computing device comprising:
   a signal line;
   a voltage source;
   a pull-up device coupling the voltage source to the signal line;
   an integrated circuit producing signals for provision to the signal line, the integrated circuit comprising:
      an external signal connection point coupled to the signal line;
      a tri-state output circuit having an output node coupled to the external signal connection point for providing a logic high signal to the signal line, the tri-state output circuit responsive to assertion of a control signal to selectively enter a high-impedance state; and
      a control circuit coupled to the tri-state output circuit for selectively asserting the control signal in response to signals at the external signal connection point, wherein the control circuit asserts the control signal following a logic high signal of a predetermined length of time on the signal line and the predetermined length of time is related to transmission line delays of the signal line.

16. The computing device of claim 15, wherein the signal line is a sustained tri-state signal line.

17. The computing device of claim 16, wherein the signal line is configured in substantial compliance with the PCI local bus standard.

18. The computing device of claim 15, wherein the voltage source provides a voltage level greater than the operating voltage of the integrated circuit.

* * * * *